(12) United States Patent
Gazda

(10) Patent No.: US 8,017,859 B2
(45) Date of Patent: Sep. 13, 2011

(54) PHOTOVOLTAIC THIN COATING FOR COLLECTOR GENERATOR

(75) Inventor: Jerzy Gazda, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 624 days.

(21) Appl. No.: 11/873,824

(22) Filed: Oct. 17, 2007

(65) Prior Publication Data

US 2009/0104432 A1    Apr. 23, 2009

(51) Int. Cl.
    *H02N 6/00* (2006.01)
    *H01L 21/00* (2006.01)
    *H01L 31/06* (2006.01)

(52) U.S. Cl. ........ 136/250; 136/252; 136/255; 136/256; 136/258; 136/261; 438/57; 438/63; 438/96; 438/97; 257/465

(58) Field of Classification Search .......... 136/250, 136/252, 255, 256, 258, 261; 438/57, 63, 438/96, 97; 257/465
See application file for complete search history.

(56) References Cited

U.S. PATENT DOCUMENTS

| | | | | |
|---|---|---|---|---|
| 2,904,613 A * | 9/1959 | Paradise | .......... | 136/250 |
| 4,321,283 A * | 3/1982 | Patel et al. | .......... | 427/74 |
| 4,514,580 A * | 4/1985 | Bartlett | .......... | 136/250 |
| 4,582,588 A * | 4/1986 | Jensen et al. | .......... | 205/124 |
| 5,057,439 A * | 10/1991 | Swanson et al. | .......... | 438/98 |
| 5,567,357 A * | 10/1996 | Wakita | .......... | 252/514 |
| 5,672,214 A * | 9/1997 | Arthur et al. | .......... | 136/250 |
| 5,797,999 A * | 8/1998 | Sannomiya et al. | .......... | 136/258 |
| 6,620,997 B2 * | 9/2003 | Kyoda et al. | .......... | 136/250 |
| 6,762,359 B2 * | 7/2004 | Asai et al. | .......... | 136/250 |

OTHER PUBLICATIONS

NDT Resource Center, Thermal Conductivity, http://www.ndt-ed.org/EducationResources/CommunityCollege/Materials/Physical_Chemical/ThermalConductivity.htm (last retrivied May 20, 2010).*
Mitwalsky "Structure of amorphous silicon investigated by high resolution electron microscopic methods", J. Phys. D Appl. Phys. vol. 22, Sep. 1989, pp. 1333-1339.*

* cited by examiner

*Primary Examiner* — Basia Ridley
*Assistant Examiner* — Devina Pillay
(74) *Attorney, Agent, or Firm* — Turocy & Watson, LLP

(57) ABSTRACT

Photovoltaic coatings and methods of making photovoltaic coatings are provided. The photovoltaic coating contains a semiconductor layer containing semiconductor elements such as silicon particles between bottom metal-semiconductor compounds and upper metal-semiconductor compounds. The upper metal-semiconductor compounds can exist at uppermost boundary portions between semiconductor elements and not substantially over uppermost surfaces of the semiconductor elements. The method can involve forming a semiconductor layer comprising semiconductor elements such as silicon particles over a conductive layer; forming first metal-semiconductor compounds at a bottom surface of the semiconductor layer; and forming second metal-semiconductor compounds at uppermost boundary portions between the semiconductor elements.

10 Claims, 7 Drawing Sheets

US 8,017,859 B2

PHOTOVOLTAIC THIN COATING FOR COLLECTOR GENERATOR

TECHNICAL FIELD

Described are photovoltaic thin coatings for collector generators and methods of making photovoltaic thin coatings for collector generators.

BACKGROUND

The most readily available source of renewable energy is the sun. Solar energy can be harnessed and converted directly into electrical energy by the use of photovoltaic collector generators or solar cells. Photovoltaic collector generators or solar cells are semiconductor devices which convert sunlight into electricity. At the heart of such devices is a semiconductor p-n junction which forms a photo diode. When the p-n junction is illuminated with light of an appropriate wavelength, an electron-hole pair is generated; the electron and the hole are pulled in opposite directions by the internal electric fields of the p-n junction. The resulting photo current can be used to drive an electrical appliance downstream such as a pocket calculator or a battery charger.

Conventional photovoltaic collector generators typically employ the use of high purity, single crystal silicon (e.g., crystal ingot) which is doped to produce either a p-type or n-type material. The doped crystal is sliced into discs or wafers and, depending upon the doping, either an electron donor or an electron acceptor is diffused into selected regions to form p-n junctions. Electrodes are then applied respectively to the diffused and nondiffused regions.

In conventional photovoltaic collector generators, the major cost factor is determined by the requirement of sawing silicon ingots into discs or wafers. Sawing is an expensive process, and results in the loss of approximately half the costly crystal ingot material as silicon dust. This technique, while resulting in the production of an acceptable photovoltaic device, is expensive and time-consuming, particularly in the cost of diamond sawing the silicon. Furthermore, the size of the collector generator is limited by the size of the wafer which is, in turn, limited by the size of the single crystal ingot. While the size may be increased using cast silicon sheet, the costs are commensurately increased by the use of such techniques.

SUMMARY

The following presents a simplified summary of the innovation in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the subject innovation described herein provides photovoltaic coatings. The photovoltaic coating contains semiconductor elements between bottom metal-semiconductor compounds and upper metal-conductor compounds. The upper metal-semiconductor compounds can be used as an upper electrode and can exist at uppermost boundary portions between semiconductor elements and not substantially over uppermost surfaces of the semiconductor elements. As a result, penetration of light into the semiconductor elements is not prevented and/or mitigated with an upper electrode over the semiconductor elements, thereby improving the photoelectric conversion efficiency per unit area of the photovoltaic coating.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

DETAILED DESCRIPTION

Figure 1A:
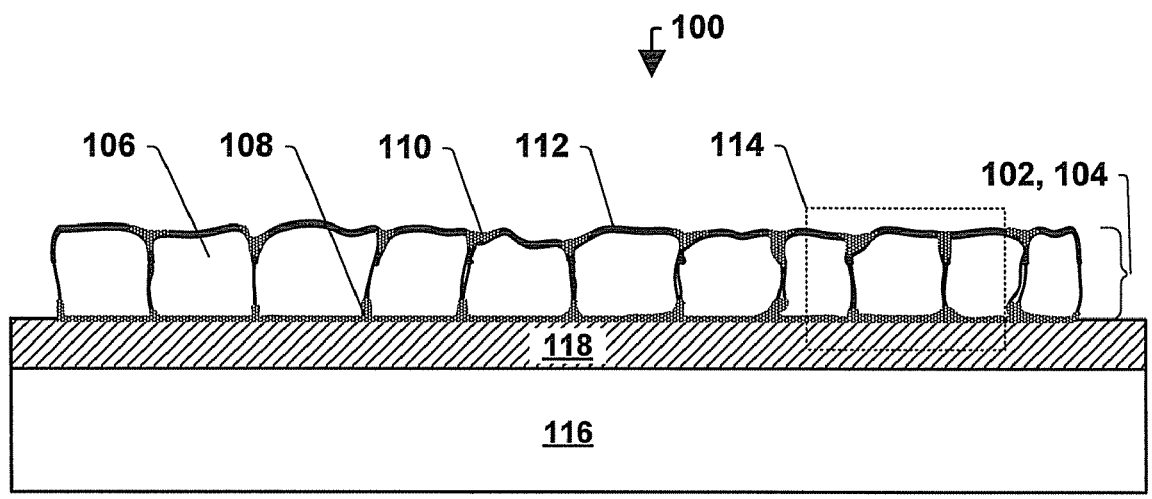
FIGS. 1a and 1b illustrates a cross sectional view of a portion of an exemplary photovoltaic coating in accordance with a first aspect of the innovation.

The subject innovation described herein provides photovoltaic coatings, methods of forming the photovoltaic coatings, and methods of increasing photoelectric conversion efficiency. The photovoltaic coating contains semiconductor elements between bottom metal-semiconductor compounds and upper metal-semiconductor compounds. The subject innovation does not need the use of a crystal ingot. As a result, by the use of semiconductor elements such as silicon particles, the photovoltaic coating is, essentially, not limited to a particular size of, for example, a silicon crystal ingot. Consequently, the photovoltaic coating can be economically produced leading to the economic production of solar cells.

Moreover, the upper electrode of the metal-semiconductor compounds can exist at uppermost boundary portions between semiconductor elements such as silicon particles but not substantially over uppermost surfaces of the semiconductor elements. As a result, the upper electrode does not inhibit, prevent, or mitigate penetration of light into the photovoltaic coating, thereby improving the photoelectric conversion efficiency per unit area of the photovoltaic coating. In another embodiment, by containing the upper metal-semiconductor compounds at uppermost portions of the boundaries between the semiconductor elements (e.g., silicon particles), the height or thickness of the photovoltaic coating can be reduced.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

FIG. 1a illustrates a cross sectional view of a portion of an exemplary photovoltaic device 100. The photovoltaic device 100 contains a photovoltaic coating 102. The photovoltaic coating 102 contains a semiconductor layer 104 containing semiconductor elements 106 between bottom metal-semiconductor compounds 108 and upper metal-semiconductor compounds 110. Metal-semiconductor materials of the bottom metal-semiconductor compounds 108 and upper metal-semiconductor compounds 110 can be selected to enhance the photoelectric conversion efficiency.

The semiconductor elements 106 can contain any suitable semiconductor material. Examples of semiconductor materials include silicon, germanium, gallium arsenide, indium phosphide, or the like. The semiconductor elements 106 can be in any suitable form/shape. The semiconductor elements 106 can be in form/shape of powder, flake, particle, granule, pellet, tablet, chips, sphere, plate, rod, or the like. For example, the semiconductor elements 106 are silicon particles.

The bottom metal-semiconductor compounds 108 and the upper metal-semiconductor compounds 110 can contain any suitable metal-semiconductor compounds. Examples of semiconductor compounds include meal silicides, metal germanides, metal germanosilicides, or the like. The bottom metal-semiconductor compounds 108 can be the same as or different from the upper metal-semiconductor compounds 110. Although the photovoltaic device 100 can employ any suitable semiconductor element and any suitable bottom and upper metal-semiconductor compound, the innovation is hereinafter illustrated and described in the context of an exemplary photovoltaic device containing silicon particles as the semiconductor elements and metal silicides as the bottom and upper metal-semiconductor compounds.

The upper metal silicides 110 can exist at uppermost boundary portions between silicon particles 106 and not substantially over uppermost surfaces of the silicon particles 106. In other words, the uppermost surfaces of the silicon particles 106 do not substantially contain conductive materials. The upper metal silicides 110 can be continuous over substantially all the silicon particles 106. The silicon particles 106 can contain implanted layers 112 in the top surfaces of the silicon particles 106. A portion of the photovoltaic device 100 indicated by a dashed line 114 is exploded in FIG. 1b.

The photovoltaic device 100 can contain any suitable other layer/component. For example, in one embodiment, the photovoltaic device 100 contains a substrate 116 on which the photovoltaic coating is formed. In another embodiment, the photovoltaic device 100 contains a metal layer 118 under the silicon layer 104. The bottom metal silicides 108 can be formed by a chemical reaction between the bottom surfaces of the silicon layer 104 and the metal layer 118. In yet another embodiment, the photovoltaic device 100 contains insulative materials (not shown) between the silicon particles 106 in the silicon layer 104. In still another embodiment, the photovoltaic device 100 contains a protective layer (not shown) over the photovoltaic coating 102.

Figure 1B:
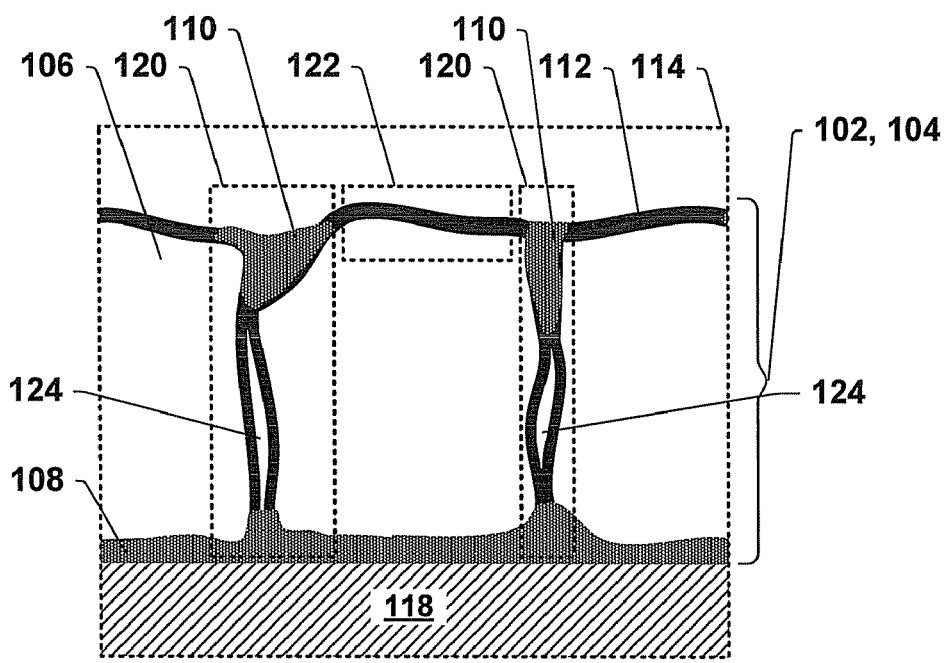

FIG. 1b illustrates an exploded view of a portion of the photovoltaic device 100 indicated by a dashed line 114 in FIG. 1a. In this example, a semiconductor layer 104 contains semiconductor elements 106 such as silicon particles and boundary portions 120 therebetween. The upper metal-semiconductor compounds 110 such as metal silicides are formed at uppermost portions of the boundaries 120. The upper metal silicides 110 are not substantially formed at uppermost surface 122 of the silicon particles 106. In other words, the uppermost surfaces 122 of the silicon particles 106 between the upper metal silicides 110 do not substantially contain conductive materials such as an electrode. Since any conductive material does not substantially exist over the uppermost surfaces 122 of the silicon particles 106 between the upper metal silicides 110, penetration of light into the silicon particles 106 is not inhibited, prevented, and/or mitigated, thereby improving the photoelectric conversion efficiency per unit area of the photovoltaic coating. The silicon layer 104 can contain an insulative material 124 between the semiconductor elements 106 to insulate the bottom electrode 108 from the upper electrode 110.

Since the uppermost surfaces 122 of the semiconductor elements 106 between the upper metal-semiconductor compounds 110 do not substantially contain conductive materials, the uppermost surface of the semiconductor layer 104 contains less area of conductive materials. In one embodiment, less than about 25% of the uppermost surface area of the semiconductor layer 104 contains conductive materials. In another embodiment, less than about 20% of the uppermost surface area of the semiconductor layer 104 contains conductive materials. In yet another embodiment, less than about 15% of the uppermost surface area of the semiconductor layer 104 contains conductive materials.

Figure 2:
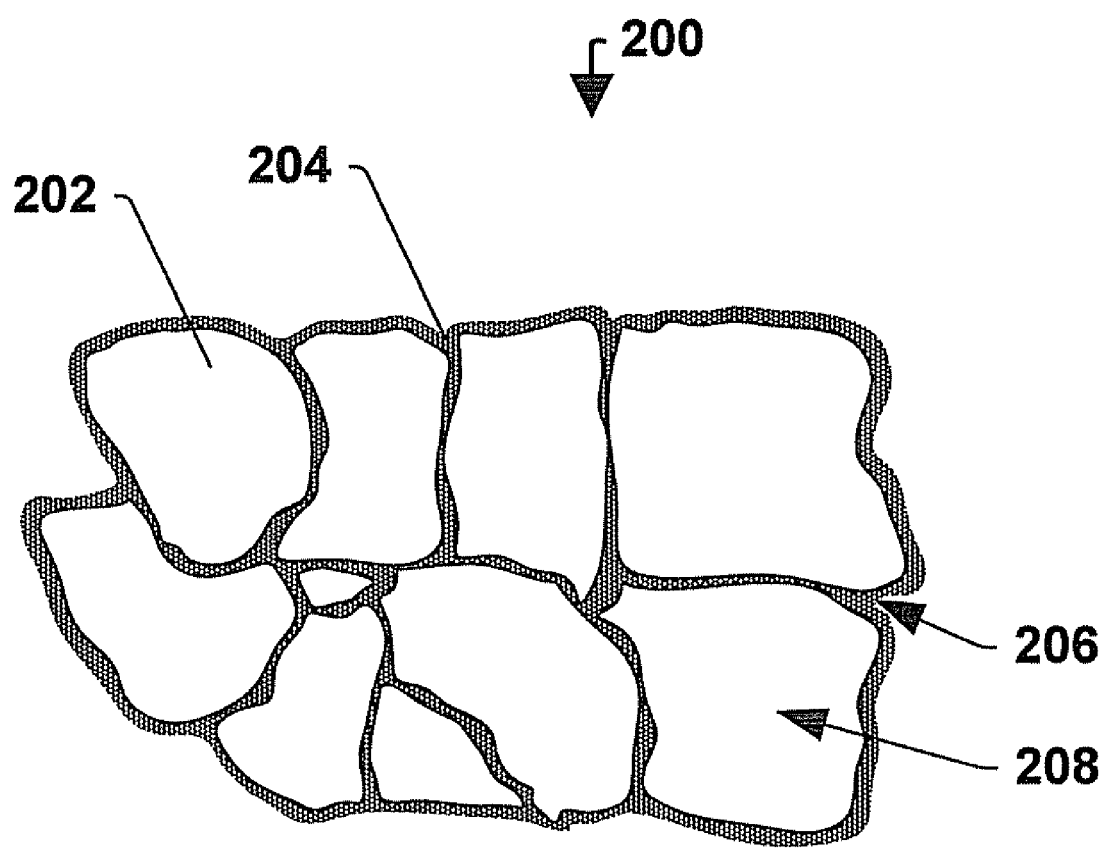
FIG. 2 illustrates a top view of a portion of an exemplary photovoltaic coating in accordance with a second aspect of the subject innovation.

FIG. 2 illustrates a top view of a portion of an exemplary photovoltaic coating 200. The photovoltaic coating 200 contains semiconductor elements 202 such as silicon particles (e.g., silicon grains or the like) on a conductive layer (e.g., a bottom electrode, not shown) and an upper electrode 204 containing upper metal-semiconductor compounds such as metal silicides.

The upper electrode 204 exists at uppermost boundary portions 206 between silicon particles 202. The upper electrode 204 does not substantially exist over uppermost surfaces 208 of the silicon particles 202. In other words, the uppermost surfaces 208 of the silicon particles 202 do not substantially contain conductive materials (e.g., electrode materials). The upper electrode 204 can be formed by, for example, heating a metal layer formed over the silicon particles 202 to cause a chemical reaction between the metal layer and the silicon particles 202 at the uppermost boundary portions 206 and removing unreacted portions of the metal layer at uppermost surfaces 208 of the silicon particles. The metal silicides can be continuous over substantially all the silicon particles 208.

The silicon particles 202 can contain silicon monocrystal, silicon polycrystal, amorphous, or combinations thereof. The silicon particles 202 can be modified by doping with one or more suitable dopants (e.g., a p-type or n-type dopant). It is to be appreciated that the silicon particles 202 can be in any suitable form/shape. For example, the silicon particles 202 can be in form/shape of powder, flake, particle, granule, pellet, tablet, chips, sphere, plate, rod, or the like. Silicon particles 202 have any suitable size or size range (e.g., particle distribution) as long as that size of silicon particles 202 can be used as a photovoltaic coating layer. Silicon particles 202 have a suitable particle distribution that depends upon the desired implementations and/or the photovoltaic device being fabricated. For example, the lower limit of particle size is controlled only by the ability to handle the particulate silicon.

The size or size range of silicon particles 202 can be determined by a thickness of a silicon coating film. The size or size range of silicon particles 202 can be adjusted by pulverizing silicon particles 202. In one embodiment, the silicon particles 202 can have a particle distribution wherein at least about 90% by weight of the particles 202 have a particle size of about 1 micron or more and about 500 microns or less. In one embodiment, the silicon particles 202 can have a particle distribution wherein at least about 90% by weight have a particle size of about 5 microns or more and about 200 microns or less. In one embodiment, the silicon particles 202 can have a particle distribution wherein at least about 90% by weight have a particle size of about 10 microns or more and about 50 microns or less.

Semiconductor elements such as silicon particles 202 can be formed by any suitable technique. For example, silicon particles 202 are formed by a fluidized bed process using, for example, monosilane as a source gas, by granulation in a vapor-phase reaction of a silane group, or the like. The details of the structure and manufacture of silicon particles can be found in, for example, U.S. Pat. Nos. 4,691,860 and 5,346,141, which are hereby incorporated by reference. In one embodiment, silicon particles 202 are formed by melting solar grade p-type silicon having a resistivity of about 1 ohm centimeters or more and about 10 ohm centimeters, for example. In another embodiment, silicon particles 202 are etched to remove contamination or surface damage by an etchant of nitric and hydrofluoric acids, for example.

Figures 3, 4:
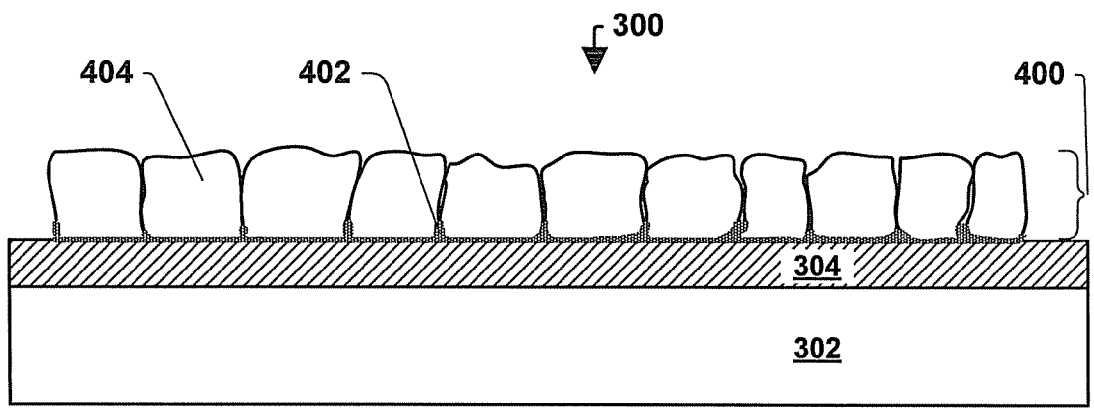
FIGS. 3-7 illustrate forming an exemplary photovoltaic device in accordance with a third aspect of the innovation.

Referring to FIGS. 3 to 7, one of many possible exemplary embodiments of forming a photovoltaic device is specifically illustrated. FIG. 3 illustrates a cross sectional view of an intermediate state of a portion of an exemplary photovoltaic device 300. The photovoltaic device 300 can contain a substrate 302 and a conductive layer 304.

The substrate 302 can contain any suitable substrate material on which a photovoltaic element can be formed. Materials of the substrate 302 may vary and are not critical to the subject innovation. Examples of substrate materials include inorganic or organic materials that are electrically conductive, semi-conductive, or dielectric. Specific examples of substrate materials include glass substrates (e.g., borosilicate glass, aluminosilicate glass, reinforced glass, synthetic quartz glass, fused quartz glass, crystallized glass, or the like); heat resistant resin substrates (polyimide or the like); metal substrates (iron, copper, aluminum, alloys such as stainless steel, or the like); ceramic substrates; or the like.

The conductive layer 304 can contain any suitable conductive material. For example, the conductive layer 304 contains any suitable metal material that can react with semiconductor materials and form metal-semiconductor compounds. The conductive layer 304 can serve as an electrode for the photovoltaic device 300. Examples of conductive materials include conductive metal, conductive metal alloys, conductive metal oxides, semiconductive materials, or the like. Specific examples of electrically conductive materials include aluminum (Al), gold (Au), platinum (Pt), copper (Cu), silver (Ag), cobalt (Co), iridium (Ir), tungsten (W), and molybdenum (Mo), ruthenium (Ru), nickel (Ni), nickel oxide (NiO), palladium (Pd), tantalum (Ta), tantalum nitride (TaN), titanium (Ti), titanium nitride (TiN), cobalt oxide (CoO), combinations and alloys thereof, or the like. The conductive layer 304 can be formed by any suitable technique. For example, physical vapor deposition (PVD), chemical vapor deposition (CVD), electroplating, sputtering, evaporation, and the like can be used to form the conductive layer 304.

The conductive layer 304 can have any suitable height so that the conductive layer 304 can be used as a bottom electrode for the photovoltaic device 300 being fabricated. In one embodiment, the conductive layer 304 has a height or thickness of about 0.01 micron or more and about 10 microns or less. In another embodiment, the conductive layer 304 has a height of about 0.05 microns or more and about 7 microns or less. In yet another embodiment, the conductive layer 304 has a height of about 0.1 micron or more and about 5 microns or less.

FIG. 4 illustrates forming a semiconductor layer 400 such as a silicon layer and first metal-semiconductor compounds 402 such as metal silicides between the semiconductor layer 400 and the conductive layer 304. The semiconductor layer 400 can be formed by, for example, placing semiconductor elements such as silicon particles (e.g., silicon grains or the like) 404 on the conductive layer 304. The silicon particles 404 can contain any of the silicon materials described in connection with the silicon particles 202 in FIG. 2.

The silicon layer 400 can contain any suitable amount of silicon particles 404. In one embodiment, the silicon layer 400 contains a large amount of silicon particles 404 so that the silicon particles 404 are in direct contact with each other. When the silicon particles 404 are in contact with each other, the silicon layer 400 contains boundaries between the silicon particles 404.

FIG. 4 also illustrates forming first metal-semiconductor compounds 402 such as metal silicides over an interface between the semiconductor layer 400 and the conductive layer 304. The first metal-semiconductor compounds 402 can be used as a bottom electrode of the photovoltaic device 300 being fabricated. The first metal-semiconductor compounds 402 can be referred to as bottom metal-semiconductor compounds or a bottom electrode. The first metal-semiconductor compounds 402 contain metal atoms from the conductive layer 304 and semiconductor atoms from the semiconductor layer 400. When the first metal-semiconductor compounds 402 contain metal silicides, the metal silicides contain metal atoms from the conductive layer 304 and silicon atoms from the silicon layer 400. Examples of first metal silicide materials include aluminum silicide, gold silicide, platinum silicide, copper silicide, silver silicide, cobalt silicide, iridium silicide, tungsten silicide, and molybdenum silicide, ruthenium silicide, nickel silicide, palladium silicide, tantalum silicide, titanium silicide, combinations thereof, or the like.

The first metal-semiconductor compounds 402 can be formed by any suitable technique. For example, when the first metal-semiconductor compounds 402 contain metal silicides, the first metal silicides 402 are formed by heating the conductive layer 304 and the silicon layer 400 to cause a chemical reaction between the two layers. During the salicidation process, the metal of the conductive layer 304 can diffuse into the silicon layer 400 and form the first metal silicides 402. As a result, the first metal silicides 402 are self-aligned to the bottom surface of the silicon layer 400.

The first metal-semiconductor compounds 402 can have any suitable height that depends on, for example, the desired implementations and/or the photovoltaic device 300 being fabricated. In one embodiment, the chemical reaction occurs at a faster rate at lowermost boundary portions between silicon particles 404 (e.g., at boundary portions between silicon particles 404 at the bottom of the silicon layer 400) than at bottom surfaces of the silicon particles 404. As a result, a larger amount of first metal silicides 402 can be formed at the boundary portions between silicon particles 404 than the bottom surfaces of the silicon particles 404. In other words, heights of first metal silicides 402 at boundary portions between silicon particles 404 are higher than heights of first metal silicides 402 at bottom surfaces of silicon particles 404.

Choice of suitable conditions and parameters (e.g., temperature, duration of heat treatment, and the like) of the silicidation process depends on, for example, the desirable dimensions (e.g., height) of the first metal silicides 402, the configuration and/or constituent of the conductive layer 304 and/or the silicon layer 400, the desired implementations and/or the photovoltaic device 300 being fabricated, or the like. For example, the first metal silicides 402 are formed by rapid thermal annealing (RTA).

Figure 5:
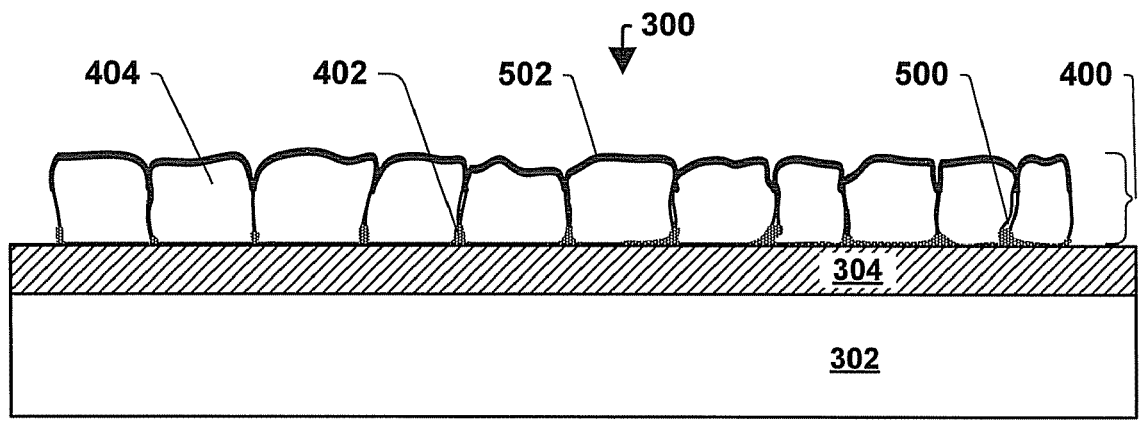

FIG. 5 illustrates forming an insulative material 500 between the semiconductor elements 402 (e.g, silicon particles) in the semiconductor layer 400 over the substrate 302 and forming implanted layers 502 in the top surfaces of the semiconductor elements 404. The insulative material 500 is formed to, for example, insulate and cover the substrate 302 and the first metal silicides 402. The insulative material 500 can contain any suitable electrically insulative material including organic insulative materials, inorganic insulative materials, and composites of both organic and inorganic insulative materials. Examples of organic insulators include polyimides, benzocyclobutenes, parylenes, polyacrylates, polyvinylbutyrals, polyvinylphenols, and the like. Examples of inorganic insulators include silicon based dielectric materials, oxide dielectric materials, nitride dielectric materials, silicates, high k materials, and low k materials. Examples of silicon based dielectric materials include silicon dioxide, and silicon oxynitride. Examples of silicates include fluorine doped silicon glass (FSG), tetraethylorthosilicate (TEOS), borophosphotetraethylorthosilicate (BPTEOS), phosphosilicate glass (PSG), borophosphosilicate glass (BPSG), and other suitable spin-on glasses. Examples of low k materials include one or more of polyimides, fluorinated polyimides, polysilsequioxane, benzocyclobutene (BCB), poly(arylene ester), parylene F, parylene N and amorphous polytetrafluoroethylene. In one embodiment, the insulative materials contain a low melting glass, e.g., having a melting point of less than about 660 degrees Celsius.

The insulative material 500 can be formed in the silicon layer 400 by any suitable technique. For example, an insulative material layer is formed over the substrate 302 and an upper portion of the insulative material layer is removed, thereby leaving insulative materials 500 in the silicon layer 400 and exposing the uppermost surface of the silicon layer 400.

The insulative material layer can be formed by any suitable technique, for example, deposition techniques (e.g., chemical vapor deposition (CVD), spin-on techniques, or the like). An upper portion of the insulative material layer can be removed by any suitable technique. For example, the upper portion is removed by chemical-mechanical polishing (CMP) and/or etching. For example, the upper portion of the insulative material layer is polished by CMP down to the upper surface of the silicon layer 400 under any suitable condition to facilitate removing/polishing the upper portion. The conditions generally depend upon, for example, the thickness of the insulative material layer, the composition of the insulative material layer, the desired implementations and/or the photovoltaic device 300 being fabricated, or the like.

The upper portion of the insulative material layer can be removed by etching. Etching can be carried out using any suitable etchant. For example, etching can be by a wet etch or a dry etch. Dry etching may include plasma etching, reactive ion etching (RIE), and the like. For example, when the insulative material layer contains oxide materials, the upper portion of the insulative material layer can be removed by contacting the insulative material layer with any suitable oxide etchant that does not substantially affect or damage the integrity of other layers in the photovoltaic device 300 such as the silicon layer 400. Any suitable etchant can be used as long as it is capable of removing the upper portion of the insulative material layer selective to other layers such as the silicon layer 400. Due to the removal of the upper portion of the insulative material layer, the upper surface of the silicon layer 400 can be exposed.

Implanted layers 502 can be formed in top surfaces of the silicon particles 404 by any suitable technique. For example, the implanted layers 502 are formed by implantation of one or more dopants from the top of the silicon layer 400. Any suitable implant compositions and concentrations can be employed for the implanted layers 502. For example, the implanted layers include one or more n-type dopants (e.g., arsenic, phosphorous, antimony). Such dopants can be implanted at a dose of about 0.2E15 atoms/cm$^2$ or more and about 4E15 atoms/cm$^2$ or less and at an energy level of about 2 KeV or more and about 40 KeV or less, for example. The implanted layers can have any suitable height to provide Schottky junctions in the silicon particles 404. For example, the implanted layers have a height of about 0.2 microns.

The implanted layers 502 can be formed at any suitable time. For example, the implanted layers 502 are formed at any suitable time after forming the silicon layer 400 and before forming second metal silicides described below. In one embodiment, the implanted layers 502 are formed before forming the insulative materials 500. In another embodiment, the implanted layers 502 are formed after forming the insulative materials 500.

Figure 6:
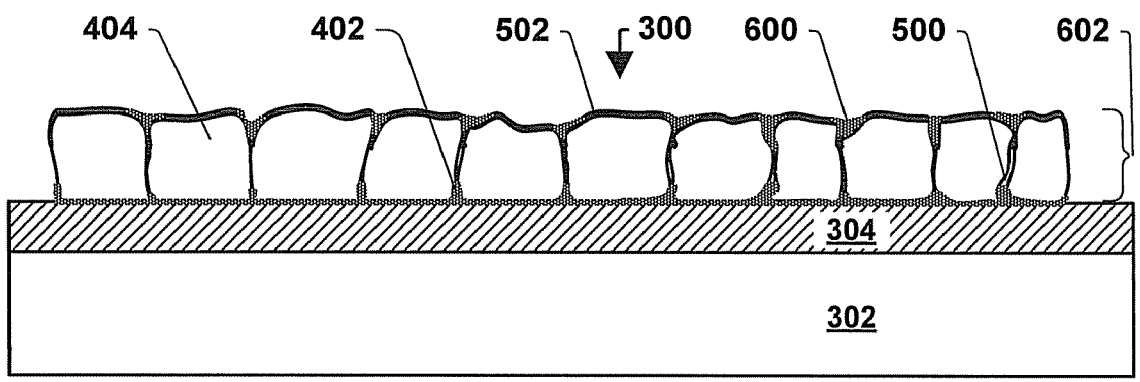

FIG. 6 illustrates forming second metal-semiconductor compounds 600 such as metal silicides at uppermost boundary portions between semiconductor elements 404 (e.g., at boundary portions between silicon particles 404 at uppermost surface of a silicon layer 400), thereby forming a photovoltaic device 300 (e.g., photovoltaic thin coating 602). In one embodiment, the second metal-semiconductor compounds 600 are formed only at uppermost boundary portions between semiconductor elements (e.g., silicon particles) 404 and are not formed at uppermost surface of the semiconductor elements 404. The second metal-semiconductor compounds 600 can contain any suitable metal-semiconductor materials. In one embodiment, the second metal-semiconductor compounds contain any suitable metal silicide materials. For example, the second metal silicides 600 contain any of the metal silicides described in connection with the first metal silicides 402 in FIG. 4. The second metal silicide 600 may be the same as or different from the first metal silicides 402.

The second metal-semiconductor compounds 600 can be formed by any suitable technique. For example, when the second metal-semiconductor compounds 600 contain metal silicides, the second metal silicides 600 are formed by forming a metal layer over the silicon layer 400, heating the metal layer and the silicon layer 400 to cause a chemical reaction between the metal layer and the silicon particles 404 at uppermost boundary portions between the silicon particles 404, and removing unreacted portions of the metal layer at uppermost surfaces of the silicon particles 404. Although not shown in the Figures, the chemical reactions occur at the bottom and top surfaces of silicon layer 400 at the same time to form first and second metal silicides 402, 600.

The metal layer can contain any suitable metal material. For example, the metal layer contains any of the metals described in connection with the conductive layer 304 in FIG. 3. The metal layer can be formed by any suitable technique. For example, the metal layer is formed by PVD, CVD, electroplating, sputtering, evaporation, or the like. The metal layer can have any suitable height so that second metal silicides formed from the metal layer can be used as an upper electrode for the photovoltaic device 300. In one embodiment, the metal layer has a height of about 0.01 micron or more and about 10 microns or less. In another embodiment, the metal layer has a height of about 0.05 micron or more and about 7 microns or less. In yet another embodiment, the metal layer has a height of about 0.1 micron or more and about 5 microns or less.

The metal layer and the silicon layer 400 are heated to form second metal silicides 600 at uppermost boundary portions between silicon particles 404. By heating the metal layer and the silicon layer 400, a chemical reaction occurs between the metal layer and the silicon particles 404 at the uppermost boundary portions. In one embodiment, the chemical reaction occurs at a faster rate at uppermost boundary portions between silicon particles 404 (e.g., at boundary portions between silicon particles 404 at the top of the silicon layer 400) than at top surfaces of the silicon particles 404. This reaction can be carried out under any suitable condition. For example, by selecting suitable conditions and parameters (e.g., temperature, duration of heat treatment, and the like) of the silicidation process, second metal silicides can be substantially formed at uppermost boundary portions between silicon particles 404 but not at uppermost surface of the silicon particles 404. Choice of suitable conditions and parameters (e.g., temperature, duration of heat treatment, and the like) of the silicidation process depends on, for example, the desirable dimensions (e.g., height) of the second metal silicides 600, the configuration and/or constituent of the second metal layer and/or the silicon layer 400, the desired implementations and/or the photovoltaic device 300 being fabricated, or the like.

In one embodiment, when the metal layer contains titanium, titanium silicides are formed at uppermost boundary portions between silicon particles 404 by heating the metal layer and the silicon layer 400 at a temperature of about 250 degrees Celsius or more and about 700 degrees Celsius or less for about 5 minutes or more and about 500 minutes or less. In another embodiment, when the metal layer contains nickel, nickel silicides are formed at uppermost boundary portions between silicon particles 404 by heating the metal layer and the silicon layer 400 at a temperature of about 250 degrees Celsius or more and about 750 degrees Celsius or less for about 5 minutes or more and about 500 minutes or less.

After forming the second metal-semiconductor compounds 600 at uppermost boundary portions between semiconductor elements (e.g., silicon particles) 404, unreacted portions of the metal layer are removed. Uppermost surfaces of the semiconductor elements 404 can contain unreacted portions of the metal layer. The unreacted metal portions can be removed by any suitable technique, for example, etching. For example, the unreacted metal portions can be removed by contacting the portions with any suitable metal etchant that does not substantially affect or damage the integrity of other layers/components of the photovoltaic device 300. Examples of metal etchants include an oxidizing etchant solution. Examples of oxidizing etchants include an acidic solution containing, for example, $H_2SO_4/H_2O_2$, $HNO_3/H_2O_2$, $HCl/H_2O_2$, $H_2O_2/NH_4OH/H_2O$, $H_3PO_4$, $HNO_3$, $CH_3COOH$, and the like. Other metal etchants can also be used as long as they are capable of removing the unreacted metal portions selective to other components/layers of the photovoltaic device 300.

The resultant second metal-semiconductor compounds 600 can have any suitable height that depends on, for example, the desired implementations and/or the photovoltaic device 300 being fabricated. In one embodiment, the second metal-semiconductor compounds 600 have a height of about 0.1 micron or more and about 10 microns or less. In another embodiment, the second metal-semiconductor compounds 600 have a height of about 0.3 micron or more and about 7 microns or less. In yet another embodiment, the second metal-semiconductor compounds 600 have a height of about 0.5 micron or more and about 10 microns or less.

The second metal-semiconductor compounds 600 are formed by a chemical reaction between the semiconductor layer 400 and the metal layer formed on the upper surface of the semiconductor layer 400. As a result, the second metal-semiconductor compounds 600 are self-aligned to the upper surface of the semiconductor layer 400. In one embodiment, the second metal-semiconductor compounds 600 are formed at uppermost boundary portions between semiconductor elements 404 due to the difference of the chemical reaction rates between the boundary portions and the top surface portions of semiconductor elements 404. As a result, the second metal-semiconductor compounds 600 are self-aligned to the uppermost boundary portions between semiconductor elements 404. Since the second metal-semiconductor compounds 600 do not substantially exist over the uppermost surfaces of the semiconductor elements 404, the second metal-semiconductor compounds 600 do not prevent and/or mitigate penetration of light into the semiconductor layer 400, thereby improving the photoelectric conversion efficiency per unit area of the photovoltaic coating 602. This can allow the use of lower powered light sources.

Since the upper surfaces of the semiconductor elements 404 contain implanted layers (e.g., n-type layers), the second metal-semiconductor compounds 600 can electrically connect substantially all the implanted layers of the semiconductor elements 404. In other words, the second metal-semiconductor compounds 600 can be continuous over the implanted layers of substantially all the semiconductor elements 404. As a result, the second metal-semiconductor compounds 600 can be used as an upper electrode of the photovoltaic device 300.

The resultant photovoltaic thin coating can have any suitable height or thickness that depends on, for example, a size of the silicon particles 404, the desired implementations, and/or the photovoltaic device 300 being fabricated. In one embodiment, the photovoltaic coating 602 has a height of about 1 micron or more and about 500 microns or less. In another embodiment, the photovoltaic coating 602 has a height of about 5 microns or more and about 200 microns or less. In yet another embodiment, the photovoltaic coating 602 has a height of about 10 microns or more and about 50 microns or less.

Figure 7:
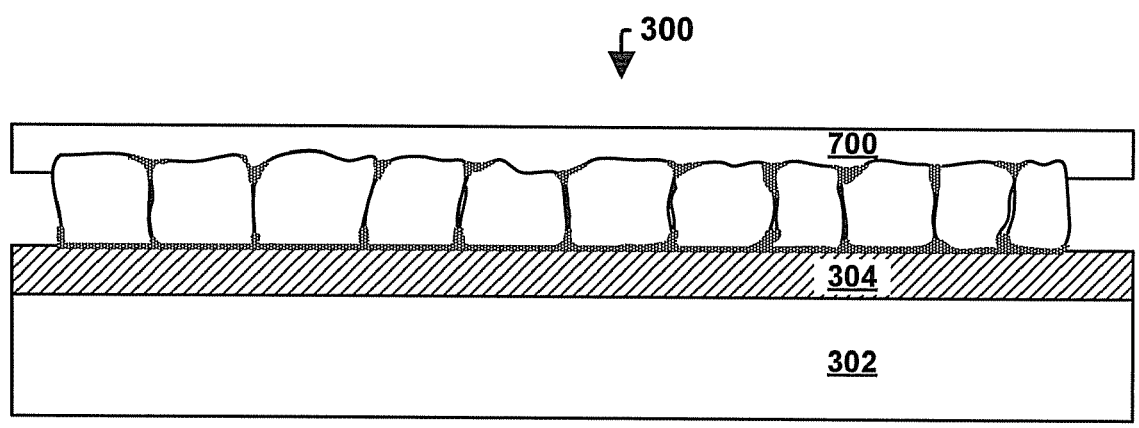

FIG. 7 illustrates forming a protective layer (e.g., protective coating) 700 over the substrate 302. The photovoltaic device 300 may or may not contain the protective layer 700. The photovoltaic device 300 may contain a protective layer to, for example, protect the photovoltaic device 300 from damage and to increase durability of the photovoltaic device 300. The protective layer 700 typically contains transparent materials. The protective layer can contain any suitable material such as insulative materials to protect the photovoltaic device 300. For example, the protective layer 700 contains any of the materials described in connection with the insulative material 500 in FIG. 5.

Figure 8:
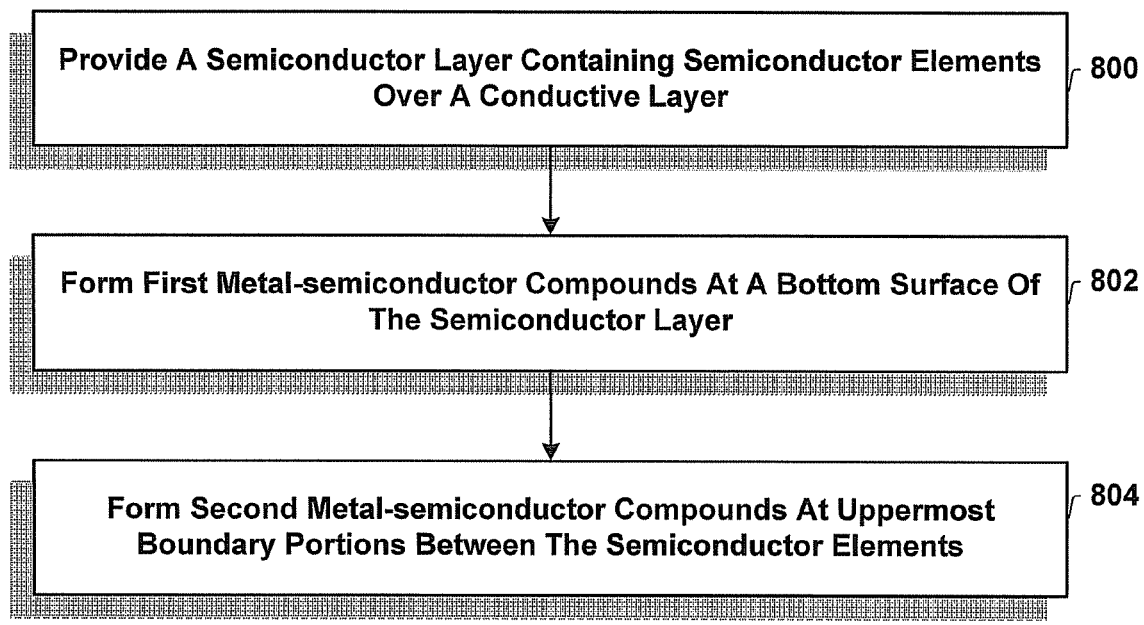
FIG. 8 illustrate exemplary methodologies of forming a photovoltaic coating in accordance with another aspect of the subject innovation.

FIG. 8 illustrates an exemplary methodology of forming a photovoltaic coating. At 800, a semiconductor layer containing semiconductor elements such as silicon particles is formed over a conductive layer. At 802, first metal-semiconductor compounds such as metal silicides are formed at a bottom surface of the semiconductor layer. At 804, second metal-semiconductor compounds such as metal silicides are formed at uppermost boundary portions between the semiconductor elements. Although not shown in FIG. 8, in one embodiment, the second metal-semiconductor compounds are formed by forming a metal layer over an upper surface of the semiconductor layer; heating the metal layer and the semiconductor layer to cause a chemical reaction between the two layers at uppermost boundary portions between the semiconductor elements; and removing unreacted portions of the metal layer at uppermost surfaces of the semiconductor elements. The unreacted metal portions at uppermost surfaces of the semiconductor elements can be removed by contacting the unreacted portions with metal etchants. In another embodiment, the methodology includes forming implanted layers in top surfaces of the semiconductor elements, forming insulative materials in the semiconductor layer, forming a protective layer over the semiconductor layer, or the like.

Figure 9:
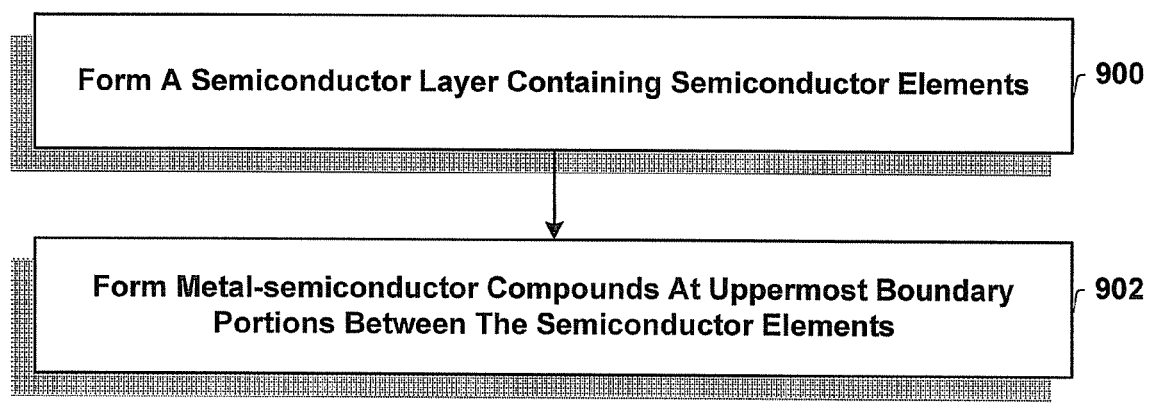
FIG. 9 illustrate exemplary methodologies of increasing photoelectric conversion efficiency in accordance with yet another aspect of the subject innovation.

FIG. 9 illustrates an exemplary methodology of increasing photoelectric conversion efficiency per unit area of a photovoltaic coating. At 900, a semiconductor layer such as a silicon layer containing semiconductor elements such as silicon particles is formed. At 902, metal-semiconductor compounds such as metal silicides are formed at uppermost boundary portions between the semiconductor elements. The metal-semiconductor compounds do not substantially exist over uppermost surfaces of the semiconductor elements. Although not shown in FIG. 9, in one embodiment, the metal-semiconductor compounds can be formed by forming a metal layer over an upper surface of the semiconductor elements; heating the metal layer and the semiconductor elements to cause a chemical reaction between the metal layer and the semiconductor elements at uppermost boundary portions between semiconductor elements; and removing unreacted portions of the metal layer at uppermost surfaces of the semiconductor elements. In another embodiment, the methodology includes forming other metal-semiconductor compounds such as metal silicides at bottom surfaces of the semiconductor elements.

Although not shown in FIGS. 8 and 9, the photovoltaic coating fabrication processes described herein can further include any suitable semiconductor structure fabrication processes. General examples of semiconductor structure fabrication processes include masking, patterning, etching, planarization, thermal oxidation, implant, annealing, thermal treatment, and deposition techniques normally used for making semiconductor structures.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications and variations that fall within the spirit and scope of the appended claims. Furthermore, to the extent that the term "contain," "include," and "involve," are used in either the detailed description or the claims, such terms are intended to be inclusive in a manner similar to the term "comprising" as "comprising" is interpreted when employed as a transitional word in a claim.

What is claimed is:

1. A method of making a photovoltaic coating, comprising:
    forming a semiconductor layer comprising placing semiconductor elements over a conductive layer, the semiconductor elements having top surfaces and bottom surfaces and being separated by boundary portions, wherein the boundary portions comprise lowermost boundary areas adjacent the bottom surfaces of the semiconductor elements and uppermost boundary areas adjacent the top surfaces of the semiconductor elements;
    forming first metal-semiconductor compounds comprising first metal silicides in the lowermost boundary areas; and
    forming second metal-semiconductor compounds comprising second metal silicides in the uppermost boundary areas; wherein the second metal-semiconductor compounds are formed by:
        forming a metal layer over the top surfaces of the semiconductor elements and the uppermost boundary areas;
        heating the metal layer and the semiconductor layer to cause a chemical reaction between the metal layer and the semiconductor elements at the uppermost boundary areas; and
    removing unreacted portions of the metal layer at the top surfaces of the semiconductor elements.

2. The method of claim 1, wherein the removing the unreacted portions of the metal layer at the top surfaces of the semiconductor elements comprises contacting the unreacted portions with metal etchants.

3. The method of claim 1, further comprising forming implanted layers in the top surfaces of the semiconductor elements.

4. The method of claim 1 further comprising forming insulative materials in the semiconductor layer.

5. The method of claim 1 wherein the semiconductor elements comprise silicon particles.

6. The method of claim 1 wherein the first and second metal-semiconductor compounds are formed at the same time.

7. A method of increasing photoelectric conversion efficiency per unit area of a photovoltaic coating, comprising;
    forming a semiconductor layer comprising placing semiconductor elements over a conductive layer, the semiconductor elements having top surfaces and bottom surfaces and being separated by boundary portions, wherein the boundary portions comprise lowermost boundary areas adjacent the bottom surfaces of the semiconductor elements and uppermost boundary areas adjacent the top surfaces of the semiconductor elements, wherein the semiconductor elements comprise silicon particles, that have a particle size of 1 micron or more and about 500 microns or less; and
    forming metal-semiconductor compounds comprising metal silicides in the uppermost boundary areas between the semiconductor elements; wherein the metal-semiconductor compounds are formed by:
        forming a metal layer over the top surfaces of the semiconductor elements and the uppermost boundary areas;
        heating the metal layer and the semiconductor elements to cause a chemical reaction between the metal layer and the semiconductor elements at the uppermost boundary areas; and
        removing unreacted portions of the metal layer at the top surfaces of the semiconductor elements so that the metal-semiconductor compounds do not substantially exist over the top surfaces of the semiconductor elements.

8. The method of claim 7 further comprising forming other metal-semiconductor compounds in the lowermost boundary areas.

9. The method of claim 7 further comprising, forming implanted layers in the top surfaces of the semiconductor elements.

10. The method of claim 8, wherein the metal-semiconductor compounds and the other metal semiconductor compounds are formed at the same time.

* * * * *